United States Patent
Takagi

(10) Patent No.: US 6,615,390 B1
(45) Date of Patent: Sep. 2, 2003

(54) METHOD OF MANUFACTURING IC CARDS

(75) Inventor: Susumu Takagi, Sawa (JP)

(73) Assignees: Hitachi, Ltd., Tokyo (JP); Hitachi Tokyo Electronics Co., Ltd., Tokyo (JP)

( * ) Notice: Subject to any disclaimer, the term of this patent is extended or adjusted under 35 U.S.C. 154(b) by 0 days.

(21) Appl. No.: 09/763,082

(22) PCT Filed: Aug. 19, 1998

(86) PCT No.: PCT/JP98/03672

§ 371 (c)(1),
(2), (4) Date: Feb. 16, 2001

(87) PCT Pub. No.: WO00/11489

PCT Pub. Date: Mar. 2, 2000

(51) Int. Cl.$^7$ .............................................. G06F 17/50
(52) U.S. Cl. .............................................. 716/1; 716/2
(58) Field of Search ............................ 716/1; 714/719; 235/380, 492; 710/62, 65

(56) References Cited

U.S. PATENT DOCUMENTS 4,845,351 A * 7/1989 Hara et al. .................. 235/492

FOREIGN PATENT DOCUMENTS

| JP | 60-3082 | * | 1/1985 |
| JP | 62-74696 | * | 4/1987 |
| JP | 2-259937 | * | 10/1990 |
| JP | 3-65657 | * | 3/1991 |
| JP | 4-238278 | * | 8/1992 |

* cited by examiner

*Primary Examiner*—Vuthe Siek
*Assistant Examiner*—Naum Levin
(74) *Attorney, Agent, or Firm*—Antonelli, Terry, Stout & Kraus, LLP

(57) ABSTRACT

A IC card producing method includes testing steps which can enhance the reliability and generality of IC cards. The method of producing IC cards of the non-contact type or contact type implements a wafer processing step (step 100), wafer inspection step (step 200), COB fabrication step (step 300), COB on-card mounting step (step 400), IC card production process 0th-order issuance step (step 500), IC card inspection step (step 600), 1st-order issuance processing step (step 700), and 2nd-order issuance processing step (step 800) to complete a contact-type IC card. Particularly, the method includes the chip testing of step 200 and IC card testing of steps 500–800 for the IC card in its state having a tested chip. The method further adopts a dual testing scheme which includes a memory verification test conducted inside the internal memory, such as an EEPROM, concurrently with the IC card test by the tester.

7 Claims, 17 Drawing Sheets

METHOD OF MANUFACTURING IC CARDS

TECHNICAL FIELD

The present invention relates to technology concerning the production of IC cards, and, more particularly, to technology which is applicable effectively to the process of IC card production, including reliable and general testing steps adapted to a variety of IC cards.

BACKGROUND OF THE INVENTION

In the technology which the inventors of the present invention have studied, there is for example an IC (Integrated Circuit) card, which has the same shape as cards with magnetic stripes, represented by credit cards and cashless cards for banking, which are widely used in the current society, and in which a CPU (Central Processing Unit) and memory are incorporated. The use of IC cards is expected to grow in the future, particularly as a portable information recording medium utilizing the most advanced technology of the high-level information society. Such an IC card is capable of exchanging information with an external device through contact terminals or a non-contact antenna coil while being controlled by a control program which is run by the CPU. The built-in memory is controlled so that it is accessible only in response to operation in accordance with a certain procedure for effecting complete security.

The IC card has a variety of functions, and, therefore, its pre-shipment testing is crucial. The testing scheme for the IC card is described for example in the publication of ISO/IEC 7816-3, IC cards and IC cards with external terminals, Part 3: electrical signals and transmission protocol. This publication suggests a IC card data writing test using a tester, for example, in which the tester sends a write command to the IC card and the IC card acknowledges the end of writing to the tester. On completion of several items of test based on the response to the transmitted commands, IC cards excluding faulty ones are shipped.

A study on the testing scheme for the IC card conducted by the inventors of the present invention has revealed the following concerns.

(1) Among a variety of IC cards having extensive fields of application, IC cards used in specific fields, such as banking, are required to be highly reliable in regard to the storage area of the internal memory and also in regard to information stored in the storage area.

(2) A variety of IC cards having extensive fields of application are required to be general so as to be adaptive to the testing with testers and the read/write operation with reader/writers.

With regard to the reliability of the storage area of an IC card memory and information in the storage area, it is an object of the present invention to provide a method of producing IC cards, including testing steps which can particularly improve the reliability of the IC cards.

With regard to the generality of IC cards so as to be adaptive to various testers and reader/writers, it is another object of the present invention to provide a method of producing IC cards, including testing steps which can particularly improve the generality of the IC cards.

These and other objects and novel features of the present invention will become apparent from the following description in this specification taken in conjunction with the accompanying drawings.

SUMMARY OF THE INVENTION

Among the aspects of the present invention disclosed in this specification, representative features are summarized as follows.

An IC card producing method based on this invention includes testing adapted to a variety of IC cards, and specifically it includes a chip testing step which implements an electrical characteristic test for the chip in the form of a semiconductor wafer or a separated chip, and an IC card testing step which implements an electrical characteristic test for the IC card in its state having a tested chip.

Another IC card producing method based on this invention includes the electrical characteristic testing of an IC card, and specifically it includes an operational testing step tor the IC card internal circuit based on external test data and a verification step for the IC card internal memory.

Particularly, the operational testing step for the IC card internal circuit is designed to obtain a comparison within the IC card between write-in data and read-out data of the internal memory, such as an EEPROM, and take out only the result of comparison, i.e., agreement or disagreement, from the IC card, with data writing being retried in the case of a disagreement comparison result.

In consequence, this IC card producing method, with the chip testing steps and the IC card testing steps for the IC card in a state having a tested chip being applied thereto, can enhance the reliability of the IC cards. Specifically, although the IC parts of the memory have been tested by the IC manufacturer, instead of skipping the testing of the IC card with the chip thereon, the card test is conducted again purposely for the sake of enhanced reliability of the IC cards. Moreover, the memory verification test is conducted concurrently with the testing by the tester for the implementation of a dual testing scheme for the IC cards.

By taking out only the result of data comparison which is implemented within the IC card, the security is maintained, while the generality of the IC card can be improved. Although the write/read data comparing function for the memory is not a requisite for the IC card, it is considered to be useful for the IC card tester and reader/writer to gain a desired versatility for treating various IC cards.

The effectiveness achieved by the representative aspects of the invention disclosed in this specification will be summarized as follows.

(1) The IC card producing method, with the testing scheme including a chip testing step for implementing a electrical characteristic test for the chip and an IC card testing step for implementing an electrical characteristic test for the IC card in its state having a tested chip being applied thereto, can enhance the reliability of the IC cards.

(2) The IC card testing step, with the IC card dual testing scheme including an operational test of the IC card internal circuit based on external test data and a verification test of the internal memory of IC card being applied thereto, can enhance the reliability of the IC card internal memory.

(3) The operational testing step for the IC card internal circuit, in which write-in data and read-out data of the internal memory are compared within the IC card and only the result of comparison, i.e., agreement or disagreement, is taken out of the IC card, can maintain the security and improve the generality of the IC cards.

(4) The IC card producing method, which ranges from the semiconductor wafer processing step up to the chip on-card mounting step based on the foregoing items (1) through (3), can provide IC card production technology inclusive of highly reliable and general testing step s which are adapted to a variety of IC cards.

These and other objects and novel features of the present invention will become apparent from the following description taken in conjunction with the accompanying drawings.

BEST MODE FOR CARRYING OUT THE INVENTION

An embodiment of the present invention will be explained in detail with reference to FIG. 1 through FIG. 17.

Throughout the drawings, identical parts are referred to by the same symbols, and their explanation will not be repeated.

Figure 1B:
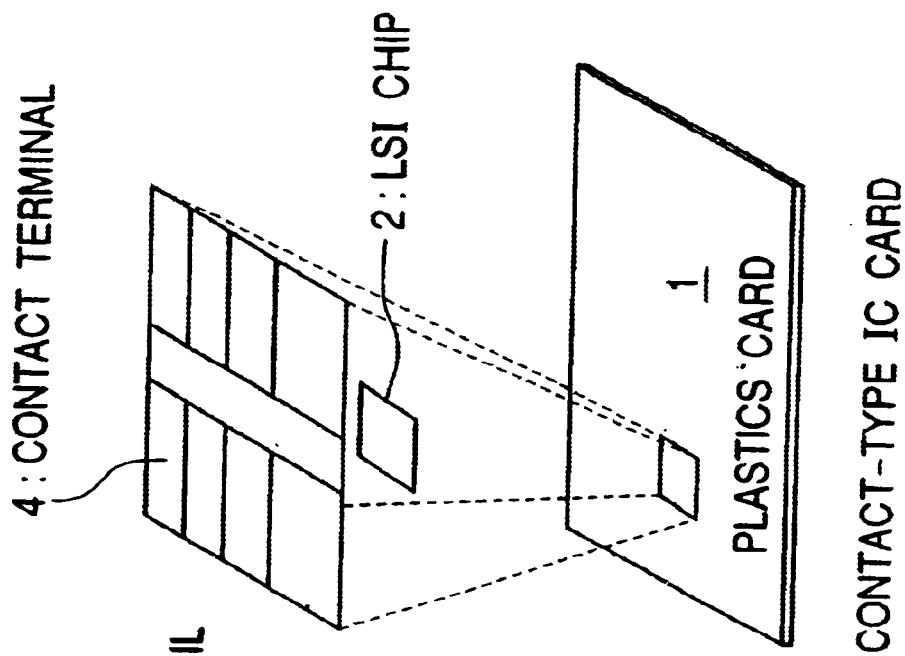
FIGS. 1(a) and 1(b) are explanatory diagrams showing in brief an example of the structure of different types of IC card applicable to this invention.
Figure 1A:
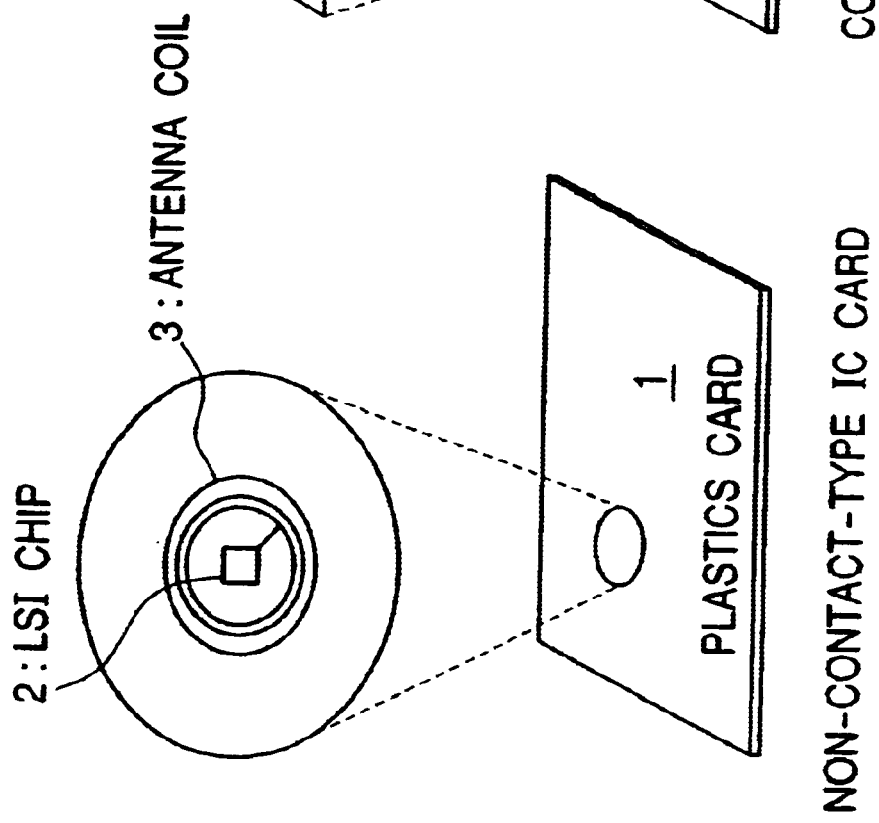

Initially, an example of the basic structure of an IC card will be explained with reference to FIGS. 1(a) and 1(b). FIG. 1(a) shows an IC card of the non-contact type which can exchange information with an external device without having physical contact with it, and FIG. 1(b) shows an IC card of the contact type which exchanges information with an external device while in physical contact with it. The non-contact-type IC card is formed of a plastics card 1, on which are mounted an LSI chip 2 and an antenna coil 3 in electrical connection with each other. The contact-type IC card is formed of a plastics card 1, on which are mounted an LSI chip 2 and contact terminals 4 in electrical connection with each other. These IC cards are dimensioned to be about 54 mm in length, about 85 mm in width, and about 0.25–0.8 mm in thickness, for example.

Figure 2:
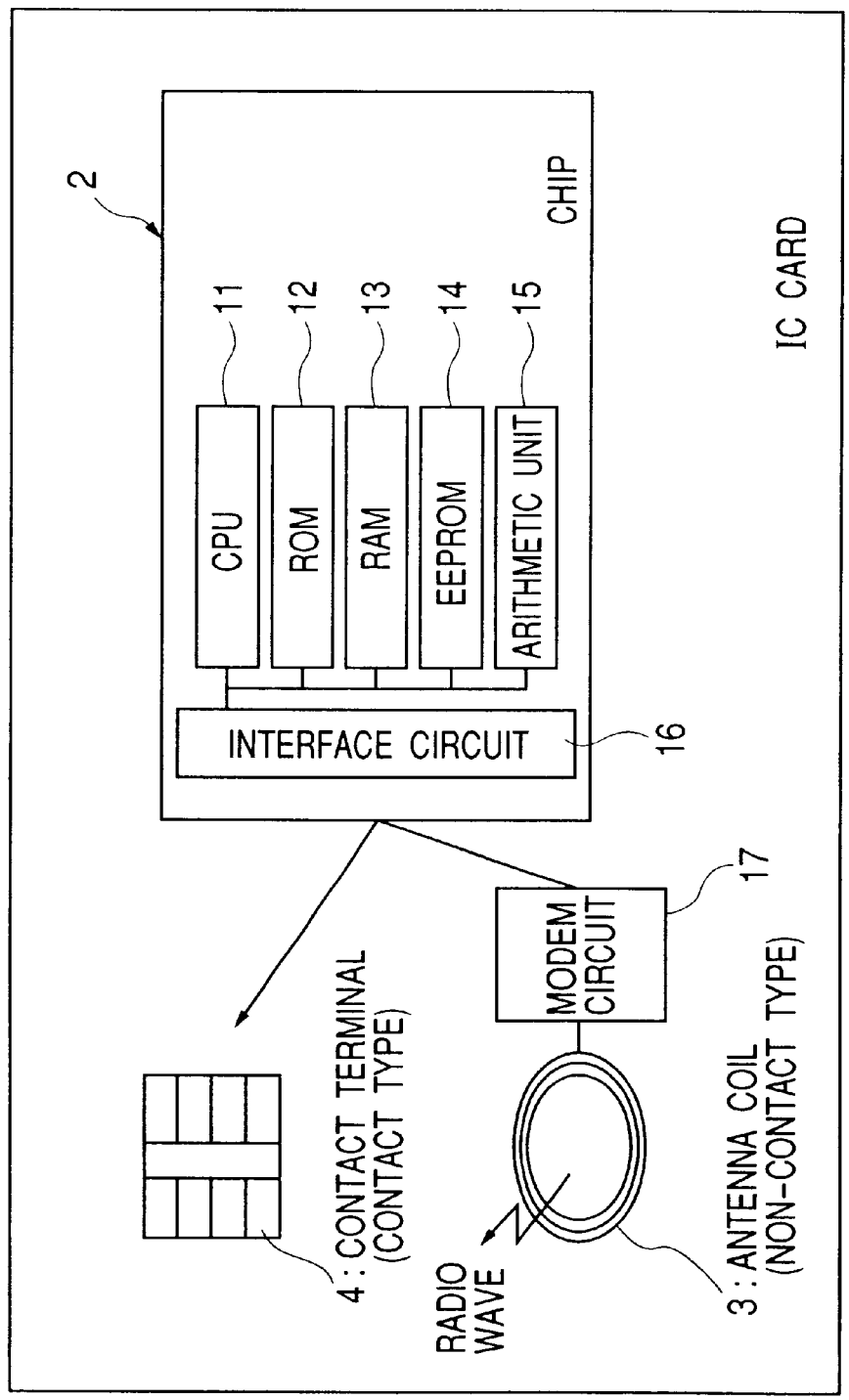
FIG. 2 is a schematic block diagram showing the internal structure of an IC card.

These IC cards have the internal arrangement of the chip 2 as shown for example in FIG. 2, including a CPU 11 which takes general control of the chip 2, a read-only memory ROM 12 which stores a program and data, a read/write memory RAM 13, an EEPROM which is electrically erasable and rewritable, an arithmetic unit 15 which implements the arithmetic operations, and an interface circuit 16 which implements a data transaction with the outside, and bidirectional data transfer can take place among these component parts. Data transfer of the chip 2 to/from an external device takes place through the interface circuit 16 in the chip 2 while being controlled by a control program which is run by the CPU 11 in the manner of radio wave transmission by means of a modulation/demodulation circuit 17 and antenna coil 3 in the case of the non-contact type, or in the manner of electrical contact by means of the contact terminals 4 in the case of the contact type. The internal memory, including the ROM 12, RAM 13 and EEPROM 14, is controlled so that it is accessible only in response to operation according to a certain procedure for the sake of data protection.

Particularly, the IC card of this embodiment has an IC card testing scheme which includes chip testing steps and IC card testing steps for the IC card in its state having a tested chip 2, and, moreover, an IC card dual testing scheme which includes an IC card internal memory test using a tester and a memory verification test conducted concurrently, as will be explained later. Items of the test for the chip 2 and IC card include a DC test plus various margin tests and an operational function test (AC function test). The DC test and margin tests include a supply voltage margin test, a signal timing margin test, an input signal voltage level margin test, an output voltage level margin test, a terminal open/short performance test, and a supply current and leakage current measurement. The operational function test includes a CPU operation test, a RAM/ROM data read/write function test, an EEPROM data read/write function test, and a floating-point arithmetic unit function test.

Figure 3:
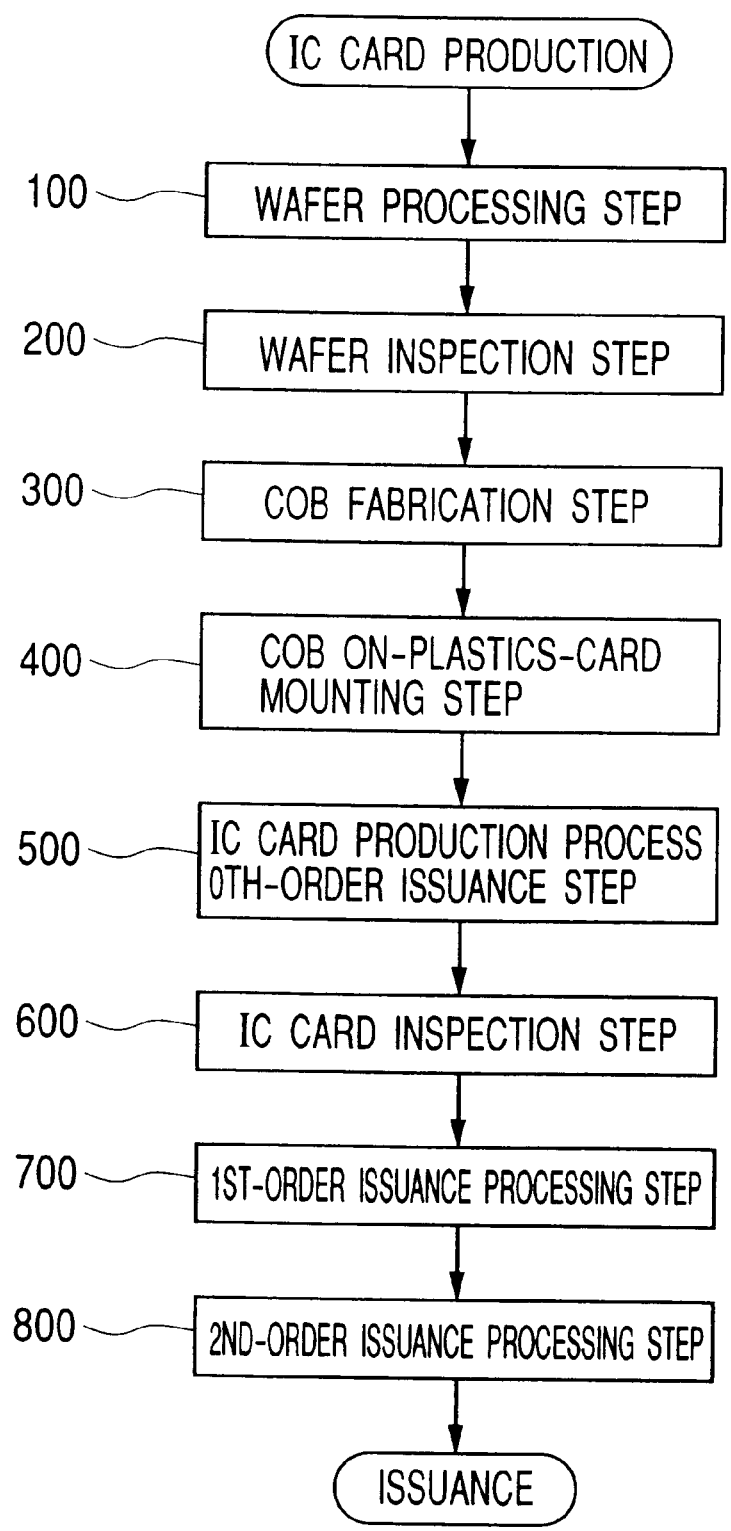
FIG. 3 is a flowchart showing the method of production of an IC card.

Next, an example of the processing steps of the IC card producing method based on this embodiment will be explained with reference to FIG. 3. Although FIG. 3 mainly shows the process of production of contact-type IC cards, the process for production of non-contact-type IC cards is virtually identical, except for the COB (chip-on-board) fabrication step, which will be explained later.

1. Wafer Processing Step: (Step 100)

The wafer processing step is a sequential process including thin film formation, oxidation, doping, annealing, resist treatment, exposure, etching, rinsing, and CMP for a semiconductor wafer, thereby to form dies of integrated circuits on the wafer. Each chip 2 corresponds to one integrated circuit.

2. Wafer Inspection Step: (Step 200)

Figure 4:
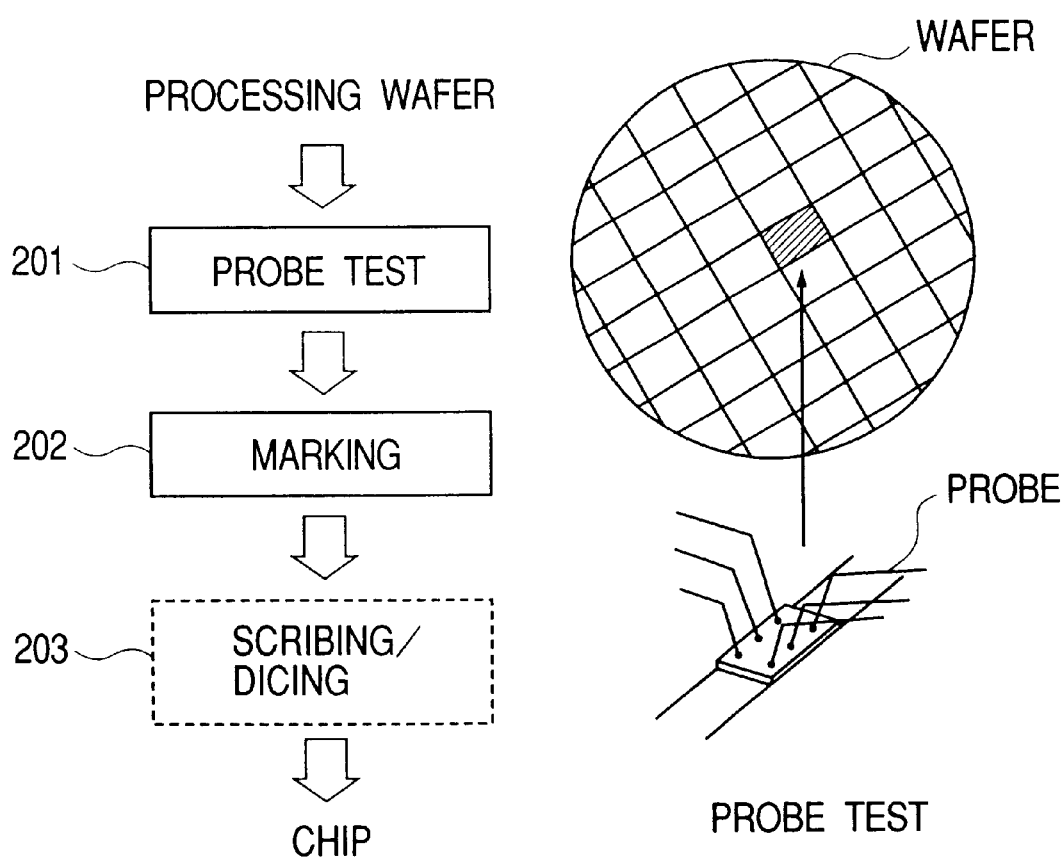
FIG. 4 is a flowchart showing the wafer inspection step in the IC card producing method.

The wafer inspection step implements a probe test for the produced semiconductor wafer by operating the wafer prober to/bring its test probes in contact with the pad of the chip 2, as shown in FIG. 4, for example: (step 201), and stores mark data or wafer map data indicative of good or faulty conditions for each chip 2: (step 202). This probe test mainly implements a DC test for examining the terminal open/short performance and for measuring the supply current and leakage current, and also implements an AC test for simple function checking. Following the scribing process and dicing process of the semiconductor wafer: (step 203), the tested chip 2 is carried to the site of the card fabrication step.

3. COB Fabrication Process: (Step 300)

Figure 5:
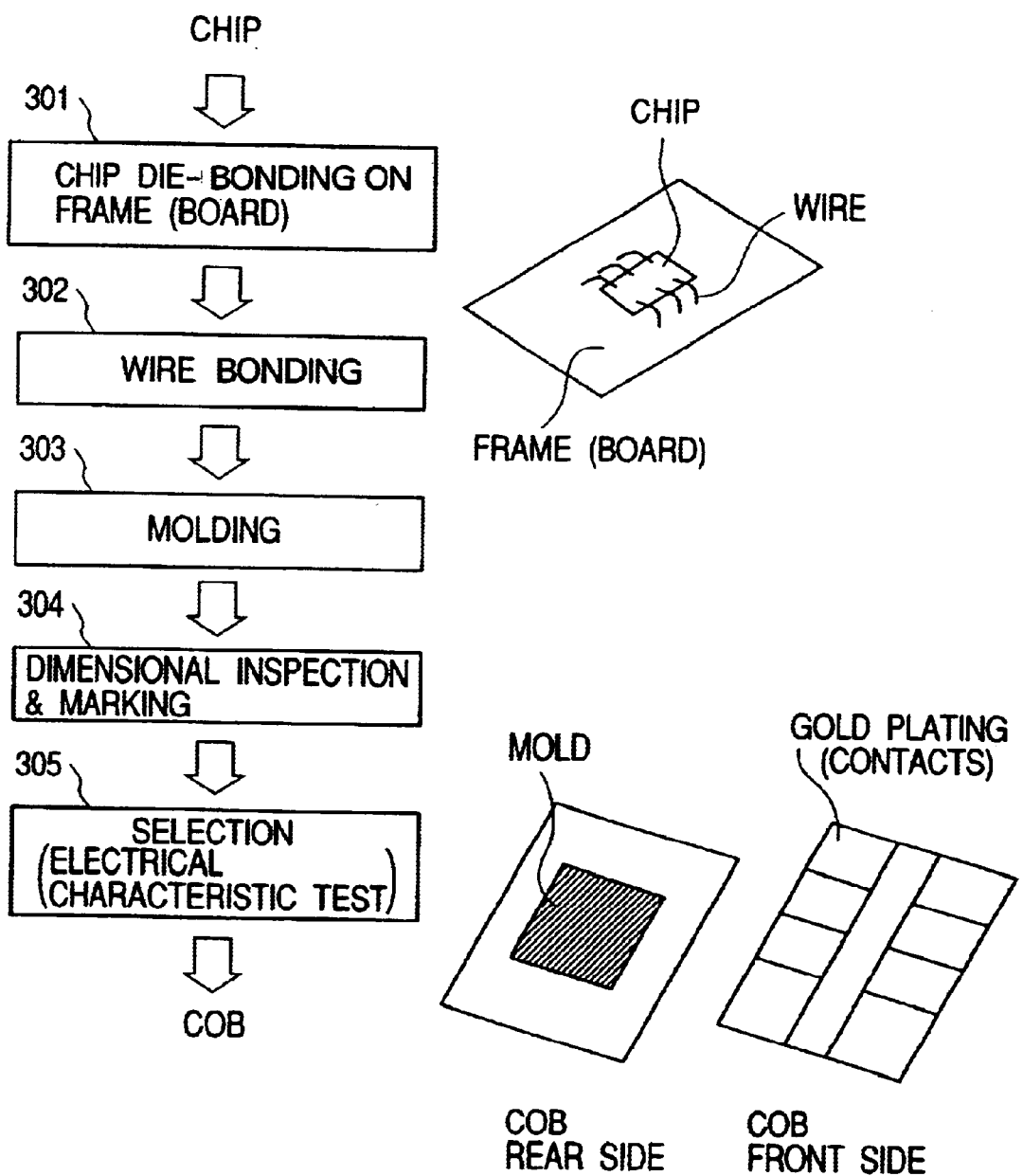
FIG. 5 is a flowchart showing the COB fabrication step.
Figure 6:
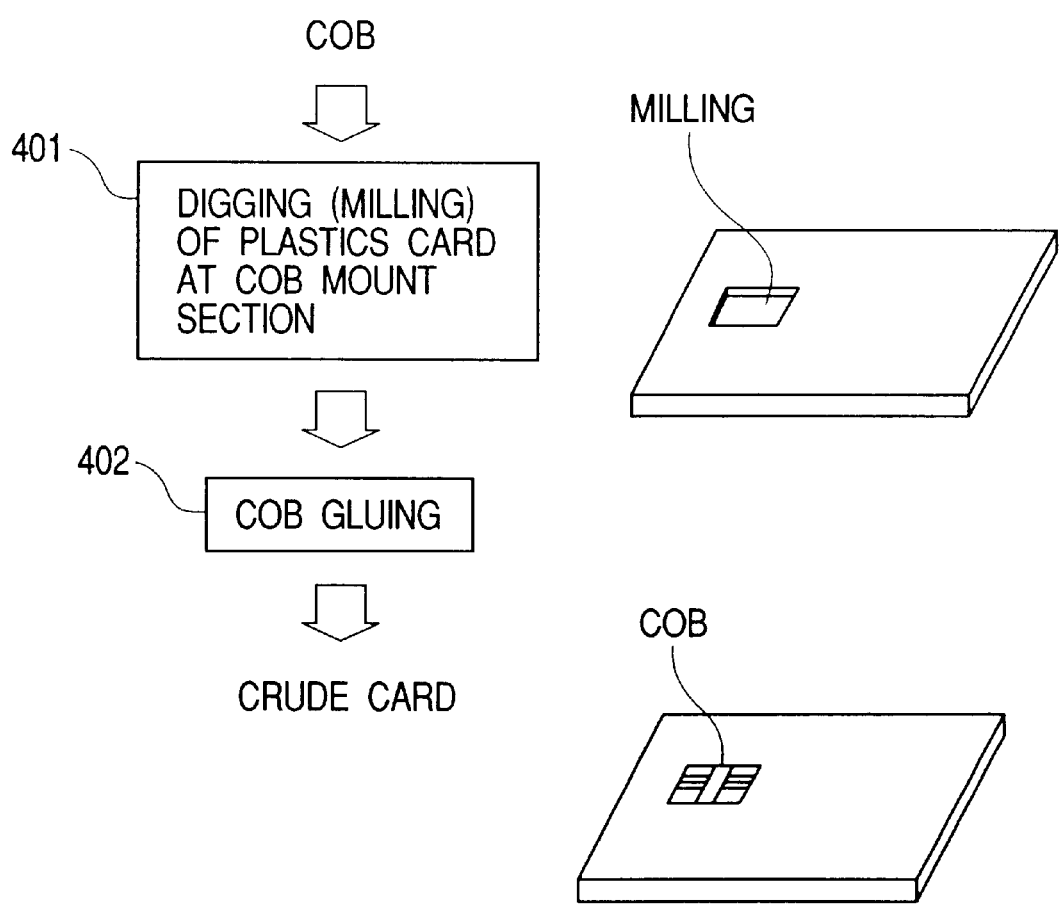
FIG. 6 is a flowchart showing the COB on-plastics-card mounting step.

The COB fabrication step implements the die-bonding of the chip 2 onto the rear side of the frame (board), as shown in FIG. 5, for example: (step 301). implements the wire bonding: (step 302), and implements the molding of the rear side: (step 303) After the wire bonding process, the chip 2 is connected to the frame through the wires, and after the molding process, the rear side is coated with the resin of the chip 2, with the contact terminals on the front side being exposed. Step 304 implements the inspection of dimensions and marking, and step 305 implements the electrical characteristic test for chip classification. The COB is carried to the site of the next processing step.

4. Chip On-plastics-card Mounting Step: (Step 400)

The chip mounting step implements the digging (milling) of the plastics card at its COB position: (step 401), and glues the COB in this place: (step 402). In this state, the contact terminals are exposed to the opening which has been formed by milling. A crude card is thus completed.

5. IC Card Production Process 0th-order Issuance Step: (Step 500)

The IC card production process 0th-order issuance step implements the hardware parts check; and, more specifically, it checks the normalcy of the IC card operation, initializes the IC card, creates an MF (master file), writes in card identifiers, (manufacturer, version information, etc.), card ID and a password function note, and implements a loop test. This step will be described in more detail later in connection with FIG. 7.

IC card testing steps are included in the IC card production process 0th-order issuance step and also in the IC card inspection step, 1st-order issuance processing step and 2nd-order issuance processing step, which will be described later. This IC card test includes a DC test plus various margin tests, which include a supply voltage margin test, a signal timing margin test, an input signal voltage level margin test, an output voltage level margin test, a terminal open/short performance test, and supply current and leakage current measurement, and an operational function test, which includes a CPU operation test, a RAM/ROM data read/write function test, an EEPROM data read/write function test, and a floating-point arithmetic unit function test, as described previously.

6. IC Card Inspection Step: (Step 600)

The IC card inspection step is a screening test of the fabricated IC card based on the cyclic reading of the card ID out of the IC card which has been written by the IC card production process function. This step will be described in more detail later in connection with FIG. 8.

7. 1st-order Issuance Processing Step: (Step 700)

The 1st-order issuance processing step involves an administrative checking of the fabricated and inspected IC card, and specifically it writes basic information, checks the basic information, creates a DF (dedicated file), an EF (elementary file) and a key, writes data, checks the written data, and establishes the security. This step will be described in more detail later in connection with FIG. 9.

8. 2nd-order Issuance Processing Step: (Step 800)

The 2nd-order issuance processing step implements the writing of individual information including the user ID. The IC card is now completed, and is ready to be issued to the user.

As described above, the contact-type IC card is produced through the course of the wafer processing step, wafer inspection step, COB fabrication step, on-plastics-card mounting step, IC card production process 0th-order issuance step, IC card inspection step 1st-order issuance processing step, and 2nd-order issuance processing step. This IC card producing method particularly includes the chip testing of step 200 and the IC card testing of steps 500–800, and adopts the testing scheme for the IC card in its state having a tested chip 2, thereby further enhancing the reliability of the IC cards.

The non-contact-type IC card is produced through virtually the same course of processing steps except for the COB fabrication step. Specifically, the chip 2 is die-bonded onto the frame (board) having the formation of the antenna coil 3, and it is wire-bonded and finally molded to complete a non-contact-type IC card. Also, in this case, the testing scheme for the IC card in its state having the tested chip 2 enhances the reliability of the IC cards. The following explanation, which mainly deals with the testing steps of the contact-type IC card, is also applicable to the non-contact-type IC card.

Figure 7:
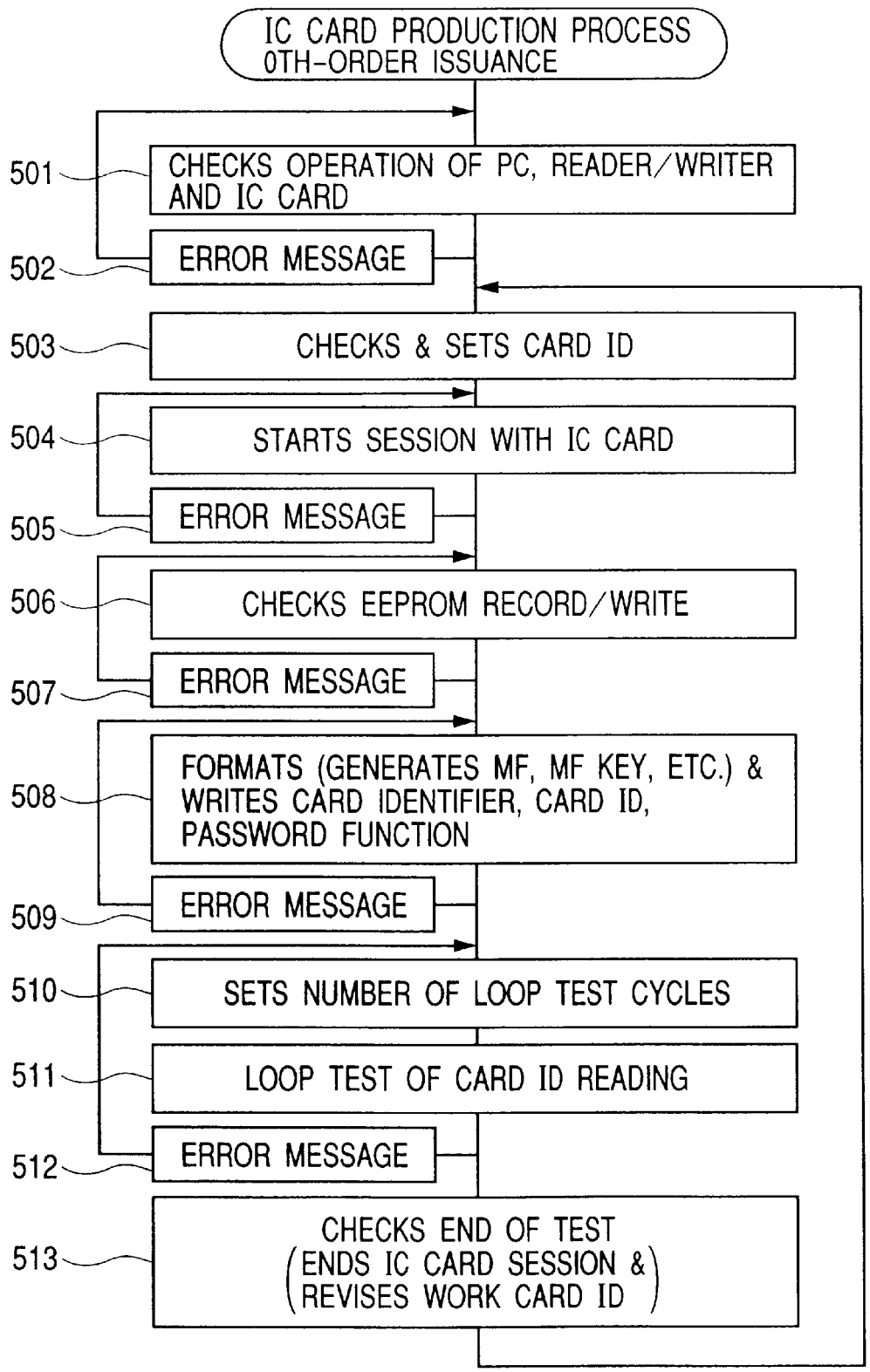
FIG. 7 is a flowchart showing the IC card production process 0th-order issuance step.
Figure 8:
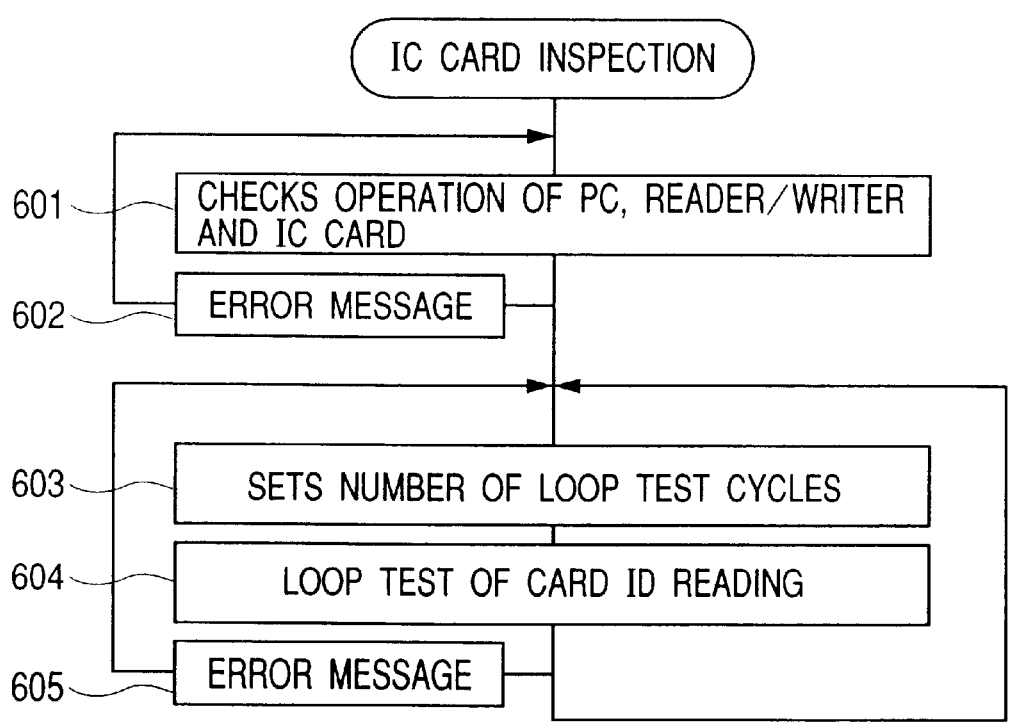
FIG. 8 is a flowchart showing the IC card inspection step.
Figure 9:
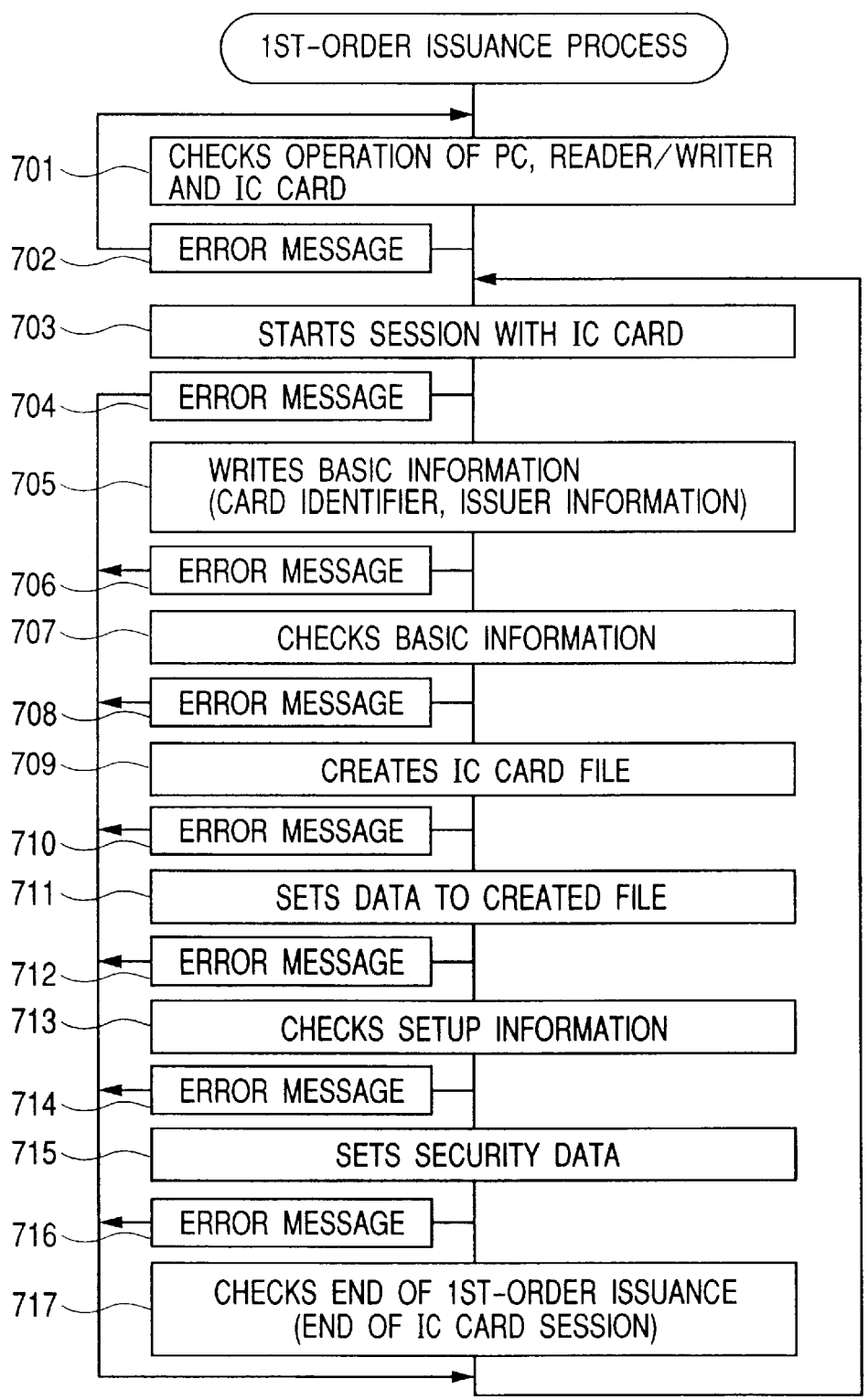
FIG. 9 is a flowchart showing the 1st-order issuance step.
Figure 10:
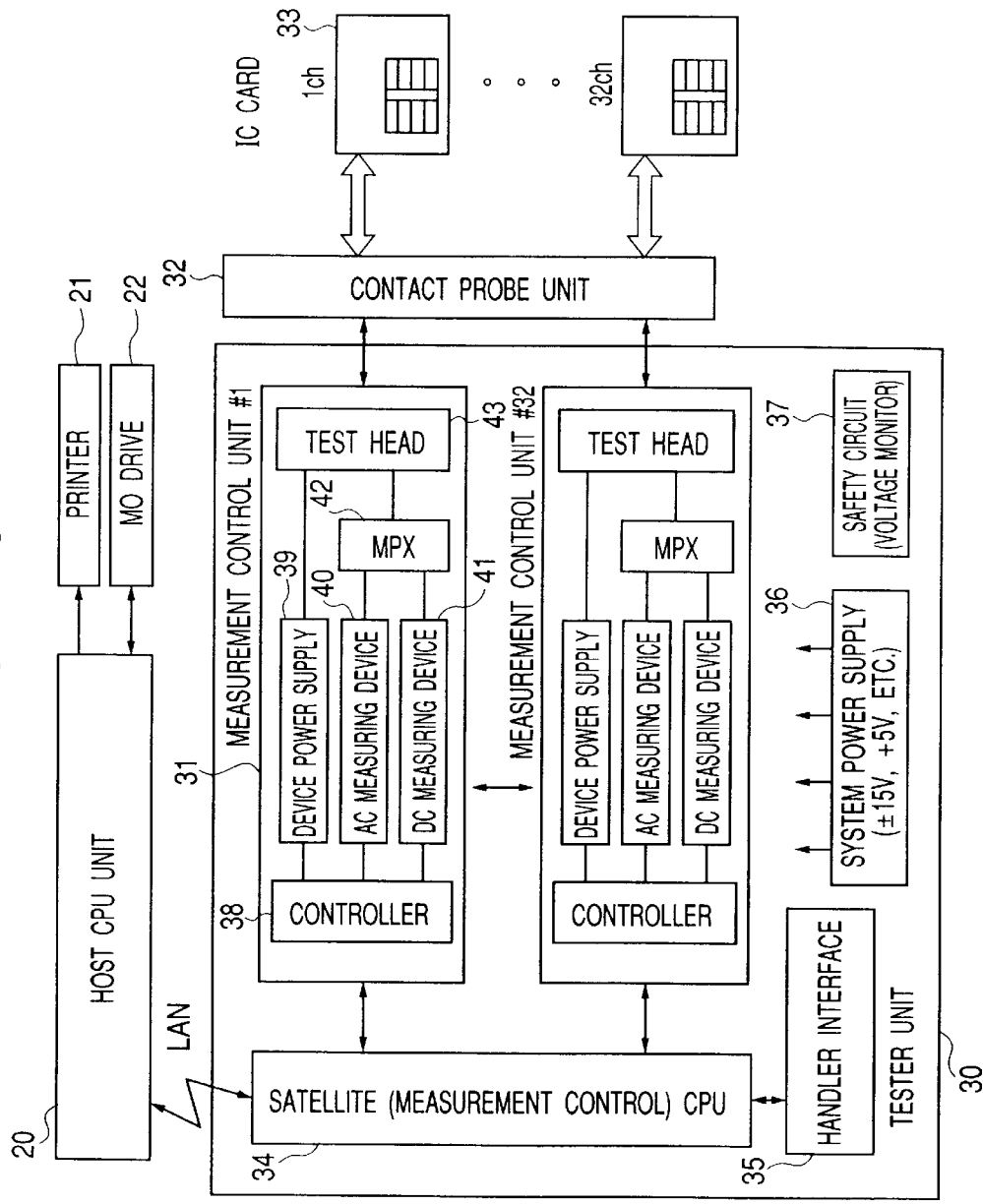
FIG. 10 is a block diagram showing the arrangement of the IC card testing/certifying equipment based on an embodiment of this invention.

Next, the IC card production process 0th-order issuance in the above-mentioned step 500, the IC card inspection in the step 600, and the 1st-order issuance processing in the step 700 will be explained in more detail by taking as an example the operation shown in the flowcharts of FIG. 7 through FIG. 9 and an example of the arrangement of the IC card testing/certifying equipment shown in FIG. 10 and FIG. 11. The IC card testing/certifying equipment of FIG. 10 implements the IC card production process 0th-order issuance step, IC card inspection step 1st-order issuance processing step and 2nd-order issuance processing step. Initially, the arrangement of the IC card testing/certifying equipment and its software organization will be explained with reference to FIG. 10 and FIG. 11, respectively.

The IC card testing/certifying equipment has the functions of a tester, reader/writer and card issuing device, and it, consists of a host CPU unit 20 which develops test condition programs and administrates testing data, and a tester unit 30 which carries out the test operation control and test planning@debugging, with these units being connected together via the LAN. The host CPU unit 20 is connected with a printer 21 and an MO drive 22 which works as an auxiliary storage, and it can be used by the user for making a testing plan and managing the measurement result. The tester unit 30 is connected via a common contact probe unit 32 to IC cards 33 through measurement control units 31, which can operate independently for individual test subjects. The tester unit 30 can include an arbitrary number of measurement control units 31 (e.g., 32 units at maximum), thereby constructing a testing system which matches with the ability of testing.

The tester unit 30 includes a satellite CPU 34, a handler interface 35, a system power supply 36, a safety circuit 37, and multiple measurement control units 31. Each measurement control unit 31 has a controller 38, a device power supply 39, an AC measuring device 40, a DC measuring device 41, an MPX 42, and a test head 43, and it can perform a test independently under control of the internal controller 38. Each of these functional blocks will be explained in detail.

The satellite CPU 34 controls the transfer of a test condition and the reception of a test result to/from the measurement control units 31, and also controls the handler interface 35. The satellite CPU 34 also has a function of test planning and debugging.

The handler interface 35 is a unit of parallel communication for controlling the IC card handler and software COB handler.

The controller 38 implements the setup of the tester hardware section in accordance with the test condition given by the user for establishing the voltages of the device power supply 39, the test condition of the AC measuring device 40 and the test condition of the DC measuring device 41, and the function of allotting probes based on the test condition, and it carries out the test for the IC card 33 and manages the test result.

The device power supply 39 has functions for establishing the voltage levels applied to the power terminals of each IC card 33 and for measuring the supply current to the IC card 33.

The AC measuring device 40 establishes the frequency and duty-cycle of the clock signal which is supplied to the IC card 33, the output voltage level of the driver and the reference level of the comparator, and carries out a test of the IC card 33 based on the data communication with it.

The DC measuring device 41 is a unit for checking the open/short state on the input/output pins of the IC card 33 and for measuring the leakage current.

The MPX 42 has a function of connecting the AC measuring device 40 and DC measuring device 41 to certain pins of the IC card 33 based on the switching of relays.

The test head 43 has drivers of signals to be supplied to the IC card 33 and comparators for judging the output signal levels. For the sake of enhanced measuring accuracy, it provides a virtual ground to minimize the measurement error attributable to cable loss.

Figure 11:
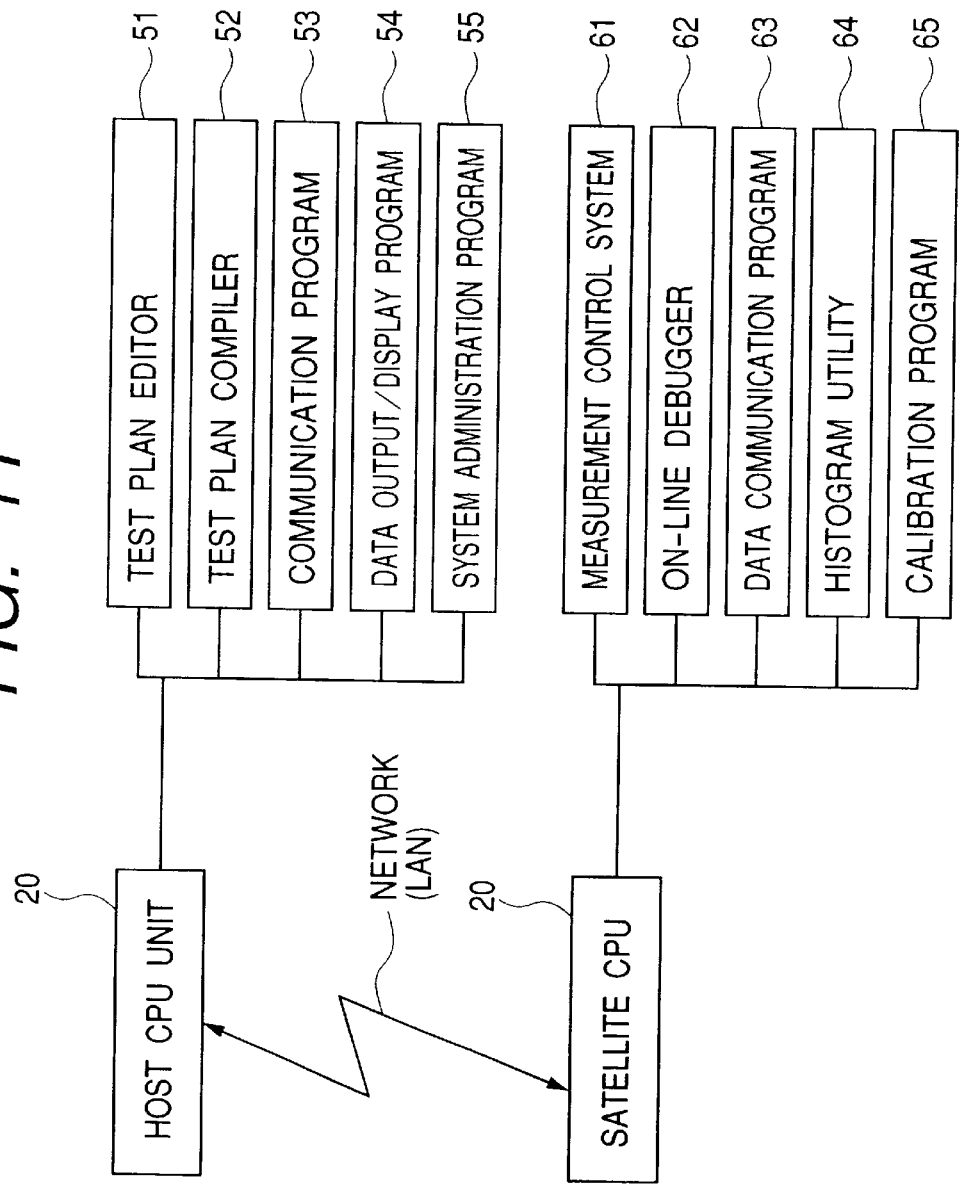
FIG. 11 is a diagram showing the software organization of the IC card testing/certifying equipment.

The host CPU unit 20 of the IC card testing/certifying equipment has a software organization as shown in FIG. 11, which includes a test plan editor 51, a test plan compiler 52, a data communication program 53, a data output/display program 54, and a system managing program 55. The satellite CPU 34 has a software organization which includes a measurement control system 61, an on-line debugger 62, a test condition and data communication program 63, a histogram utility 64, and a calibration program 65. The host CPU unit 20 and the satellite CPU 34 are linked via a network (LAN) Each of these programs will be explained in detail.

The test plan editor 51 produces the test condition, and it can activate the test plan compiler 52 directly. In the event of an error in the compilation result, it indicates the location of the error with a cursor, thereby enabling the user to make a test plan efficiently.

The test plan compiler 52 translates the test plan produced by the test plan editor 51 into an object program which can be executed by the tester. The test plan compiler 52 also produces detailed information for the debugging of the test plan.

The data communication program 53 implements the transfer (distribution) of the test plan, the reading of a measurement result, and the setting and instruction for various functions.

The data output/display program 54 delivers the test result received by data communication to the CRT unit, printer or hard-disk drive. It can also deliver the report of a test result (lot number, worker's name, test start time, test end time, total number of test pieces, numbers of good and faulty products, number of faulty products sorted on the test number, etc.).

The system managing program 5S implements the security control of the equipment based on a password or the like.

The measurement control system 61 controls the handler and controllers 38 (test executor), and controls the implementation of a test plan. The program manages the measurement results of all measurement control units 31, and sends them to the host CPU unit 20 when necessary. The result of a test in progress is displayed on the liquid crystal display panel of the tester unit 30 so that the user can know the immediate test result including the number of test pieces and the numbers of good and faulty products.

The on-line debugger 62 is a tool for debugging the test plan. It functions to run the test plan on a step-by-step basis, halt (pause) the test at a specified test plan line number or test number, alter the test condition, run the DC test or AC test or display the measurement result in response to the operation of the keyboard. This program enables the user to debug the, test plan efficiently and analyze the fault of test pieces.

The data communication program 63 receives the test plan (test condition) from the host CPU unit 20 and sends it to all controllers 38. It also receives the test results from all controllers 38 and sends them at once to the host CPU unit 20.

The histogram utility 64 computes the distribution of measurement data of each DC test item for a certain production lot of IC cards 33. The user can make reference to this data for management of the testing process.

The calibration program 65 is used to implement the calibration of hardware component devices of the IC card testing/certifying equipment, such as the measurement control unit 31, when it is replaced for the maintenance.

The IC card testing/certifying equipment arranged as described above is used to implement the IC card production process 0th-order issuance of the above-mentioned step 500, the IC card inspection of step 600, the 1st-order issuance processing of step 700, and the 2nd-order issuance processing of step 800.

Next, the IC card production process 0th-order issuance in the above-mentioned step 500 will be explained in detail by taking an example shown by the flowchart of FIG. 7.

(1) Checking Operation of PC, Reader/writer and IC Card 33: (Steps 501 and 502)

Step 501 checks the operation of the PC, reader/writer and IC card 33. In the event of an error, step 502 displays an error message. Normally, the following operations take place, for example. It opens the communication path of the PC. It opens the communication path to the reader/writer. It starts the session with the IC card 33. It terminates the session with the IC card 33. It closes the communication path to the PC. This operation is only a confirmation and following the successful session with the IC card 33, it terminates the session with the IC card 33 and closes the communication path.

(2) Checking and Setting Card ID: (Step 503)

This step generates a card ID to be written onto the IC card 33. It displays an error message if the setup value of the card ID is incorrect. In this system, the card ID is managed in the card ID information section of the file. The card ID consists of the date (6 bytes), production PC number (3 bytes) and serial number (4 bytes), for example.

The date is the date of production of the IC card 33. For the default value, the date is read out of the internal clock of the PC automatically in the format of "YYMMDD" at the commencement of operation of the card production function. The date is not revised during the cyclic producing operation.

The production PC number is used to classify the PC which has produced the IC card 33, with the default value being "001". It can be set or altered by manual operation.

The serial number indicates the order of production of the IC cards within a day. The serial number begins at "0001" at the commencement of operation of the card production function in the day, and it advances for successive products. The serial number is incremented automatically and saved in the file. It is not incremented on the occurrence of an error or when the production operation is canceled.

(3) Starting Session With IC Card 33: (Steps 504 and 505)

Step 504 starts the session with the IC card 33. In the event of error, step 505 displays an error message. Normally, the following operations take place, for example. It opens the communication path of the PC. It opens the communication path to the reader/writer. It starts the session with the IC card 33.

(4) Checking Read/write of EEPROM Area: (Steps 506 and 507)

Step 506 tests the read/write function of the EEPROM area of the memory, while displaying the situation of test in progress. In the event of an error, step 507 displays an error message. Normally, the following operations take place, for example. It writes data "00" into the system area, reads data out of the area, and compares both data. It writes data "11" into the system area, reads data out of the area, and compares both data.

(5) Formatting and Writing Card Identifier, Card ID, and Processing Password Function: (Steps 508 and 509)

Step 508 generates an MF, a key and an EF for the IC card 33 in accordance with the card production layout file. The card production layout file name is managed in the layout information section of the file. In the event of an error, step 509 displays an error message. Normally, the following operations take place, for example. It formats the IC card 33. It generates an MF. In case the card production layout file specifies the generation of a key, it generates a key. In case the card production layout file specifies the generation of an EF, it generates an EF. The card identifier and card ID are written into the created EF.

The card identifier is written into the EF of the card identifier which has been created in the above-mentioned format. In the event of an error, step 509 displays error message. Normally, the following operations take place, for example. It writes the formatted card identifier into the EF for a card identifier.

The card ID which has been checked and generated is written into a certain address location of the EEPROM. In case a file of the card identifier has been created in the above-mentioned format, the card identifier is also written into the file. In the event of an error, step 509 displays an error message. Normally, the following operations take place, for example. It writes the card identifier into a certain address location of the EEPROM. In case an EF of the card ID has been created in the above-mentioned format, the card ID is written into the EF.

In regard to the writing of a password processing function, the password processing function file specified by the password function information section is written into a certain address location of the EEPROM. A jump table file has a setup of the offset address, and the value of the jump table is modified to an address which is set in the item of the base address of the file. In the event of an error, step 509 displays an error message. Normally, the following operations take place, for example. It loads the jump table file into a certain address location of the EEPROM. It loads the parameter file into a certain address location of the EEPROM. It loads the function module file into a certain address location of the EEPROM. It converts the card ID into an 8-bit binary form and writes it over the initial value of a random number in the input parameter area.

(6) Setting the Number of Cycles of the Loop Test: (Step 510)

This step sets the number of cycles of the loop test of the IC card 33. The number of loop test cycles is managed in the ID reading loop test section of the file.

(7) Card ID Reading Loop Test: (Steps 511 and 512)

Step 511 reads the card ID which has been written in the previous card ID writing step. The test is repeated by the specified number of cycles. In the event of an error, it displays an error message. Normally, the following operations take place, for example. It reads the card ID and checks the data. These operations are repeated by the specified number of cycles.

(8) Checking the End of the Test: (Step 513)

This step checks the normal ending of the IC card ID reading loop test. The following operations take place, for example. It terminates the session with the IC card 33. It closes the communication path of the PC. It increments the serial number of the card ID by one.

Next, the IC card inspection step of the above-mentioned step 600 will be explained in detail by taking an example shown by the flowchart of FIG. 8.

(1) Checking the Operation of the PC, Reader/writer and IC Card 33: (Steps 601 and 602)

Step 601 checks the operation of the PC, reader/writer and IC card 33 in the same manner as the preceding IC card production process 0th-order issuance step. At the occurrence of an error, step 602 displays an error message.

(2) Setting the Number of Cycles of the Loop Test: (Step 603)

This step sets the number of cycles of the loop test of the IC card 33 in the same manner as the preceding IC card production process 0th-order issuance step.

(3) Card ID Reading Loop Test: (Steps 604 and 605)

Step 604 conducts the loop test of reading the card ID. The test is repeated by the specified number of cycles. At the normal ending of the test, it displays the card ID which has been read. In the event of an error, step 605 displays an error message. Normally, the following operations take place, for example. It opens the communication path of the PC. It opens the communication path to the reader/writer. It starts the session with the IC card 33. It reads the card ID and checks the data. These operations are repeated by the specified number of cycles. It terminates the session with the IC card 33. It closes the communication path of the PC. It displays the card ID which has been read.

Next, the IC card production process 1st-order issuance step of the above-mentioned step 700 will be explained in detail by taking as an example the operation shown by the flowchart of FIG. 9.

Initially, the name of the worker who writes the 1st-order issuance processing log and the PC number are set. The PC number has a default value which is, for example, the information section production PC number for the working card ID of the file. The worker's name is entered within 20 full-size characters and the PC number is entered within 3 half-size characters. If any of these items is not entered, an error message is displayed.

(1) Checking of the PC, Reader/writer and IC Card 33: Steps 701 and 702)

Step 701 checks the operation of the PC, reader/writer and IC card 33 in the same manner as the preceding IC card production process 0th-order issuance step. At the occurrence of an error, step 702 displays an error message. Data writing is not retried at the occurrence of an error during the process after the operation check of the PC, reader/writer and IC card 33.

(2) Starting the Session With the IC Card 33: (Steps 703 and 704)

Step 703 starts the session with the IC card 33. In the event of an error, step 704 displays an error message. Normally, the following operations take place, for example. It opens the communication path of the PC. It opens the communication path to the reader/writer. It starts the session with the IC card 33.

(3) Writing Basic Information: (Steps 705 and 706)

Step 705 generates an EF under the MF of the produced IC card 33 in accordance with the 1st-order issuance layout file, and writes the basic information, such as the card identifier and issuer information. The 1st-order issuance layout file name is managed in the layout information section of the file. In the event of an error, step 706 displays an error message. Normally, the following operations take place, for example. It creates an EF. It generates data to be written from the 1st-order issuance layout file. It writes the generated data into the created EF. These operations are repeated by the number of files specified in the 1st-order issuance layout file.

(4) Checking Basic Information: (Steps 707 and 708)

Step 707 checks the basic information which has been written in the previous step. In the event of an error, step 708 displays an error message. Normally, the following operations take place, for example. It reads data out of the basic information file. It compares the readout data with the written data. These operations are repeated according to the number of files specified in the 1st-order issuance layout file.

(5) Creating Files of the IC Card 33: (Steps 709 and 710)

Step 709 creates files of DF, EF, key, etc. on the IC card 33 in accordance with the user definition layout file. The user definition layout file name is managed in the layout information section of the file. In the event of an error, step 710 displays an error message. Normally, the following operations take place, for example. It transfers the file to the parent DF. It creates the file. These operations are repeated according to the number of files specified in the user definition layout file.

(6) Setting Data in the Created File: (Steps 711 and 712)

Step 711 sets data in the created file in accordance with the user definition layout file. The content of setup data is dependent on the type of the file created. In the event of an error, step 712 displays an error message. Normally, the following operations take place, for example. It generates setup data from the user definition layout file. It sets the generated data in the created file. These operations are repeated according to the number of files specified in the user definition layout file.

(7) Checking Setup Information: (Steps 713 and 714)

Step 713 checks the data which has been set previously in the created file. In the event of an error, step 714 displays an error message. Normally, the following operations take place, for example. It reads data out of the data file. It compares the readout data with the data which has been set in the created file. These operations are repeated according to the number of files specified in the user definition layout file.

(8) Setting Security Data: (Steps 715 and 716)

Step 715 sets the security data in the created file in accordance with the user definition layout file. In the event of an error, step 716 displays an error message. Normally, the following operations take place, for example. It transfers the security data to the file to be set. These operations are repeated according to the number of files specified in the user definition layout file.

(9) Checking the end of the 1st-order Issuance: (Step 717)

This step checks the normal ending of the 1st-order issuance process. The following operations take place, for example. It terminates the session with the IC card 33. It closes the communication path of the PC.

Figure 12:
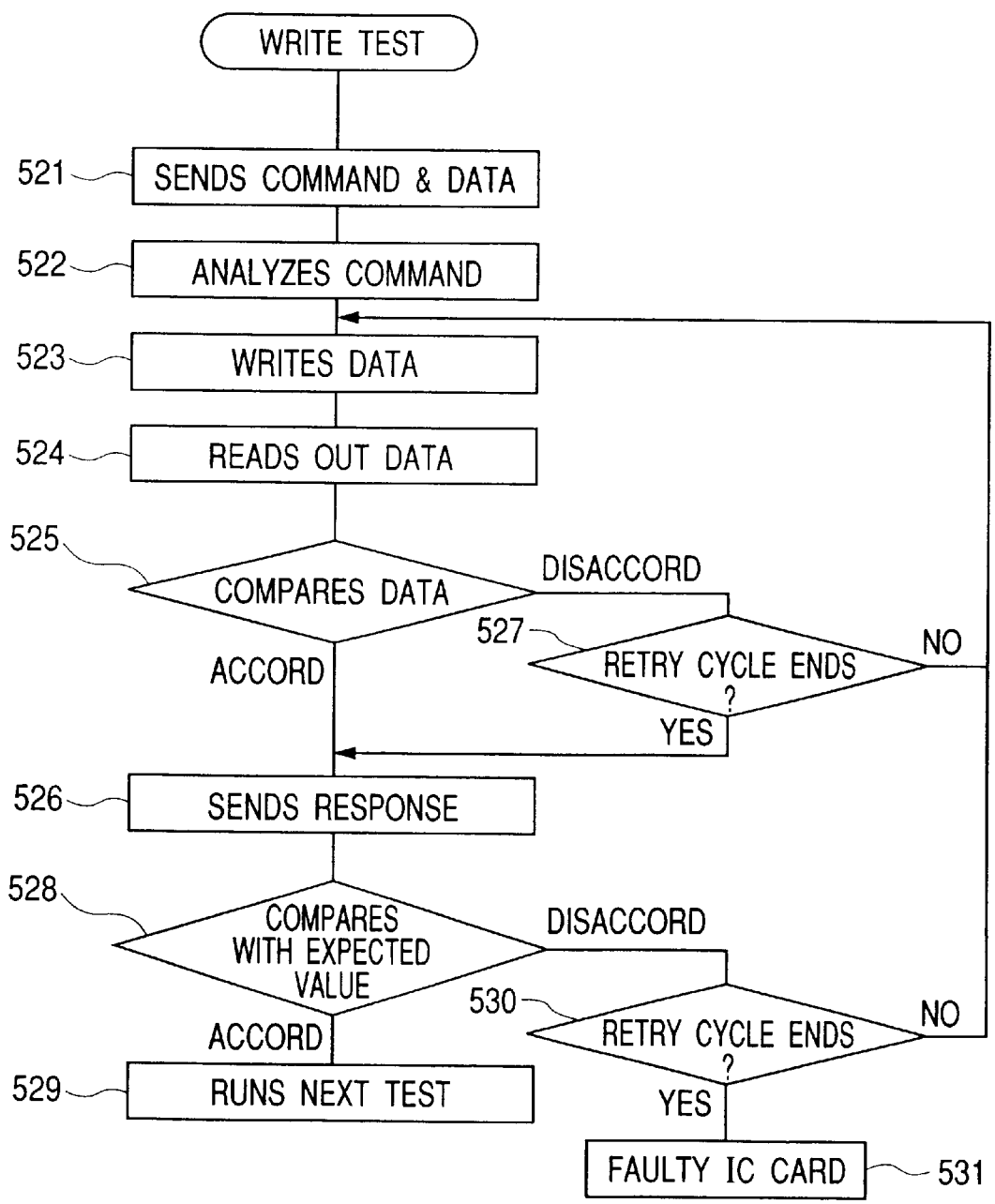
FIG. 12 is a flowchart showing the data write test of an EEPROM.
Figure 13:
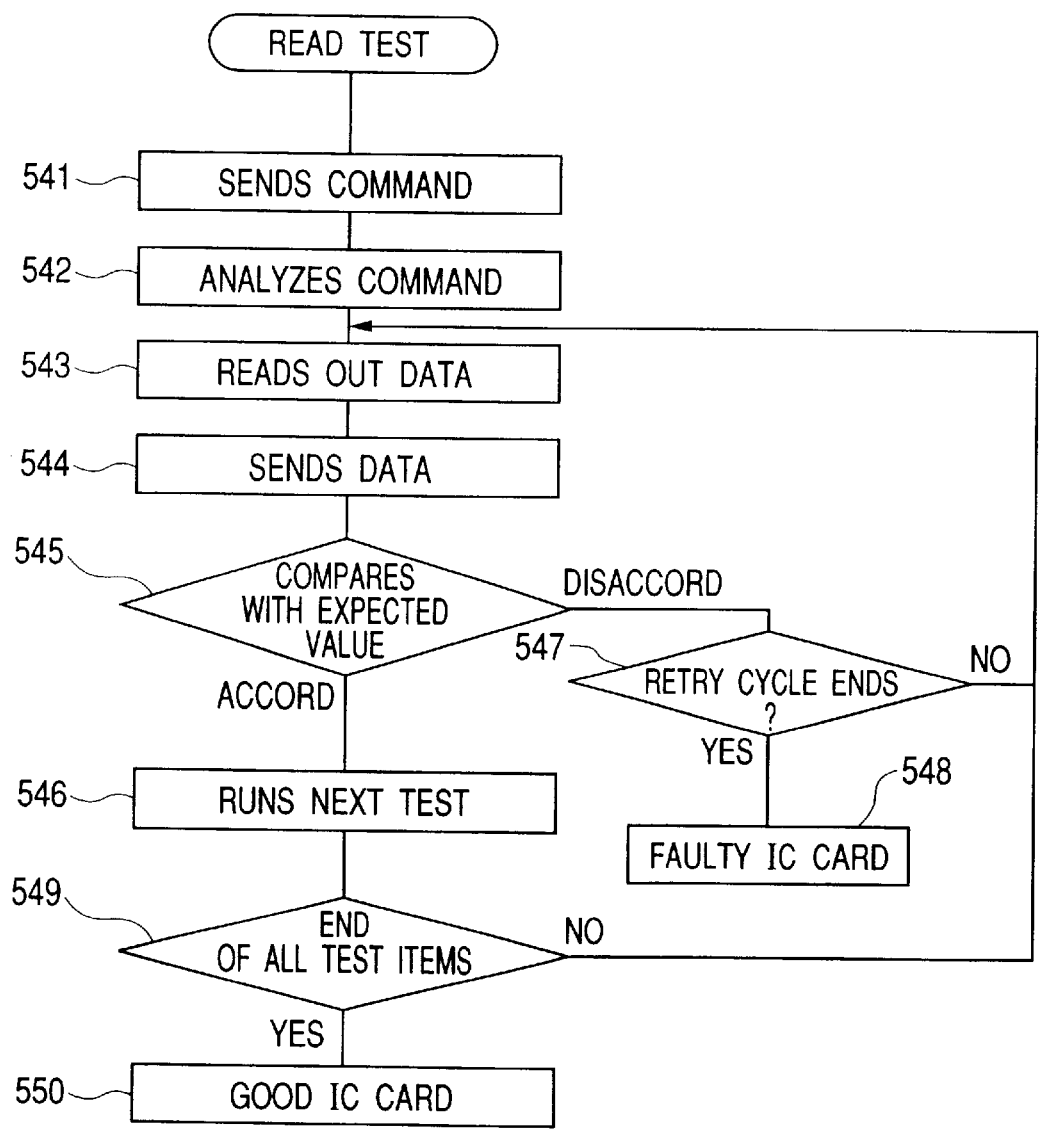
FIG. 13 is a flowchart showing the data read test of an EEPROM.
Figure 14:
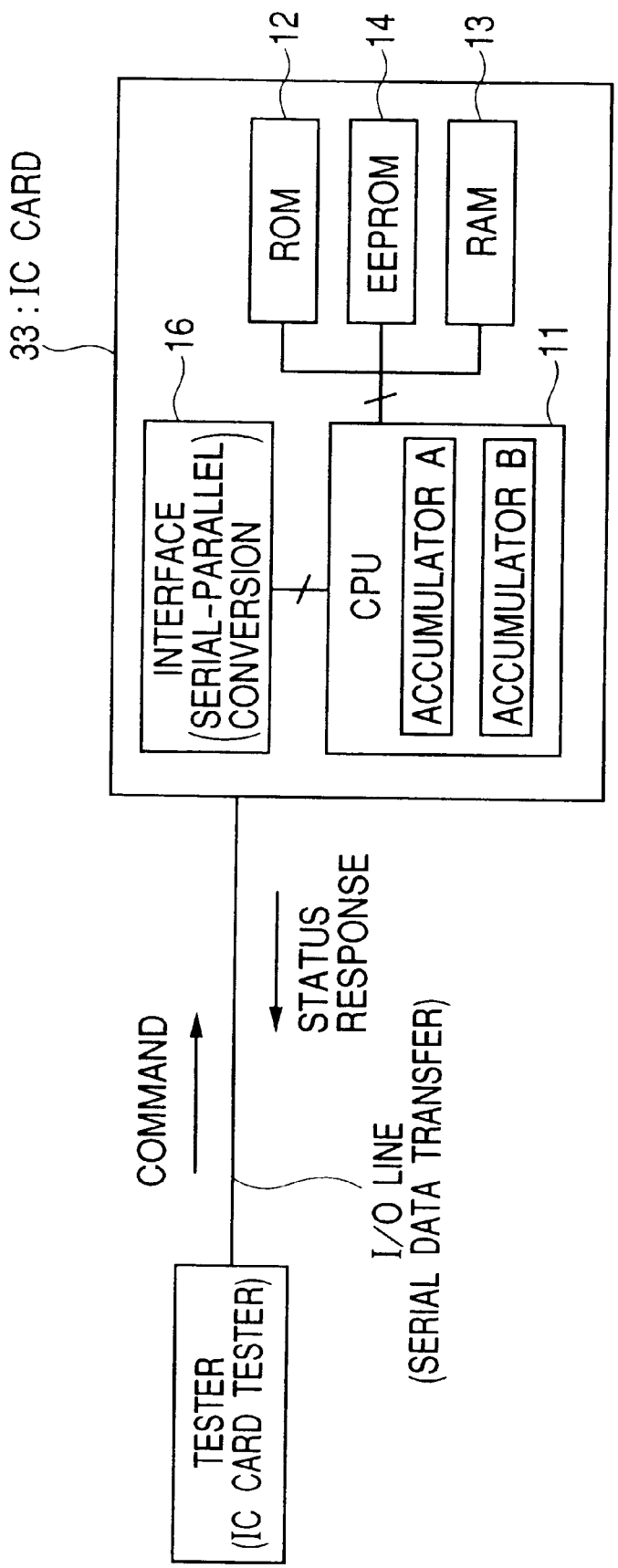
FIG. 14 is a block diagram showing the connection between the tester and IC card.

Next, the data write/record test on the EEPROM 14 in the EEPROM read/write checking process of the foregoing step 506 of IC card production process 0th-order issuance will be explained in detail by taking as an example the operation shown by the flowcharts of FIG. 12 and FIG. 13 and an example of the interconnection between the tester (IC card testing/certifying equipment) and the IC card 33 shown in FIG. 14.

This testing process, which is based on the dual testing scheme of IC card 33, includes a step involving the operation test of the internal circuit of the IC card 33 based on the testing data provided by the tester and a step of verification of the EEPROM 14 in the IC card. FIG. 14 shows the connection of the tester to the IC card 33 for the data write/read test (one testing). The tester used for this test is the IC card testing/certifying equipment shown in FIG. 10 and FIG. 11. For testing a usual IC card 33, the following testing steps are repeated while varying the write address and data to be written.

1. Write Test (1) Step 521 sends the EEPROM write command and data to be written from the tester to the IC card 33. The command and data are transmitted in compliance with the IC card communication protocol T1, T0, etc. stated in the ISO 7816.

(2) Step 522 analyzes the command with the CPU 11 in the IC card 33. Upon receiving a data write command, step 523 operates on the serial-to-parallel conversion circuit in the interface circuit 16 to convert the data to be written into parallel data, and operates on the CPU 11 to load the converted data into internal accumulator A and write the data into the specified address location of the EEPROM 14.

(3) Step 524 reads the written data out of the EEPROM 14 and loads the data into accumulator B in the CPU 11, and step 525 compares both data in the accumulator A and accumulator B. This step correlates the written data and readout data. In parallel to the write test by the test verification of written data, which will be explained later, takes place repeatedly in the EEPROM 14.

(4) In response to the result of comparison, step 526 sends a serial response signal indicative of the normal ending of data writing from the serial port of the parallel-to-serial conversion circuit in the interface circuit 16 to the tester. This response transmission also complies with the established communication protocol. Otherwise, in response to a disagreeing result of comparison, step 527 branches back to step 523 to repeat the data read/write within the IC card 33 for a certain number of times of retrial, and thereafter step 526 sends an error response signal from the serial port to the tester.

(5) Step 528 operates on the tester to compare the response signal from the IC card 33 with the threshold value of a good product. In response to the result of comparison, step 529 implements the subsequent test. Otherwise, in response to a disagreeing result of comparison, step 530 branches back to step 523 to repeat the data write/read according to a specified number of times of retrial. If all retrials end up with an error, step 531 determines that the IC card 33 is faulty.

2. Road Test

This test reads data out of the IC card 33 and checks it based on the written data.

(6) Step 541 sends the EPPROM data read command from the tester to the IC card 33.

(7) Step 542 analyzes the command with the CPU 11 in the IC card 33. Step 543 reads EEPROM data out of a certain address location into accumulator A of the CPU 11, and step 544 sends the readout data in a certain format through the serial port to the tester.

(8) Step 545 operates on the tester to compare the data sent from the IC card 33 with the threshold value for a good product. In response to a result of comparison indicating that the card 33 is a good product, step 546 implements the subsequent test. Otherwise, in response to a disagreeing result of comparison, step 547 branches back to step 543 to repeat the test according to a certain number of times of retrial. If all retrials end up with an error, step 548 determines that the IC card 33 is faulty.

(9) Step 549 checks to determine whether all tests have been completed, and step 550 indicates that the IC card 33 which has passed all the tests is a good product. An IC card which has failed any item of test is judged to be faulty, and it is collected in a faulty product tray.

In parallel to the data writing to the EEPROM 14 of the above step (2) of the write/read test by the tester, verification of written data takes place within the EEPROM 14. The verification test conducted within the EEPROM 14 will be explained in detail by taking as an example the operation shown by the flowchart of FIG. 15 and an example of the internal arrangement of EEPROM 14 shown in FIG. 16. Initially, the arrangement and operation of the EEPROM 14 will be explained briefly with reference to FIG. 16.

Figure 16:
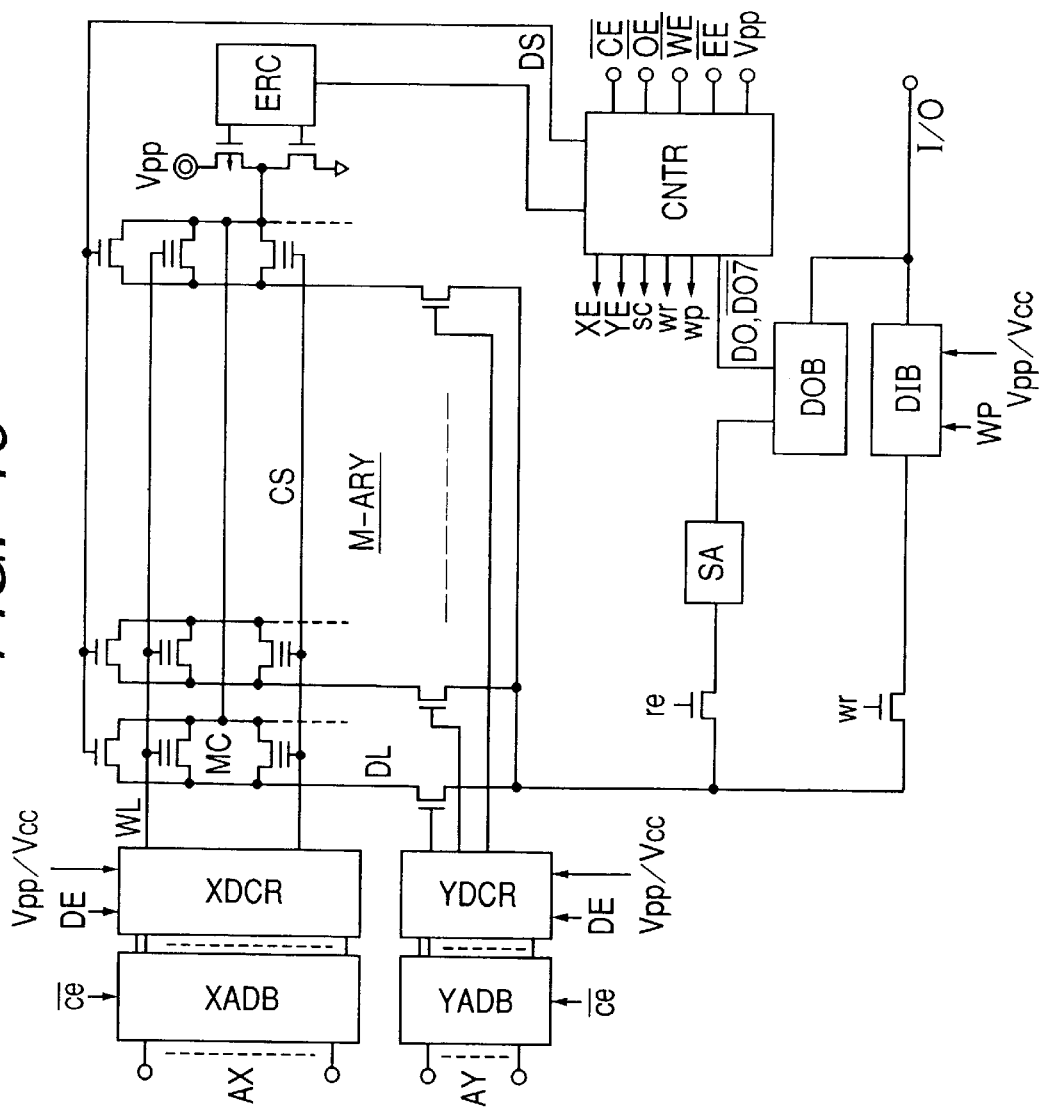
FIG. 16 is a schematic diagram showing the structure of an EEPROM.

The EEPROM 14 is made up of a memory array M-ARY consisting of memory cells MC connected between and at intersections of word lines WL and data lines DL, as shown in FIG. 16, a row address buffer XADB and column address buffer YADB for selecting a memory cell MC in the memory array M-ARY, a row address decoder XDCR and column address decoder YDCR, a sense amplifier SA for reading and writing data, a data input buffer DIB and data output buffer DOB, a timing control circuit CNTR for generating various control signals, and an erasing circuit ERC for erasing the memory cells electrically. The EEPROM 14 having the above-mentioned known arrangement is formed in each chip 2 together with a CPU 11, ROM 12 and RAM 13.

The EEPROM 14 receives external address signals AX and AY, from which the row address buffer XADB and column address buffer YADB produce a row address signal and a column address signal, which are used by the row address decoder XDCR and column address decoder YDCR to select a memory cell in the memory cell array M-ARY. The read/write operation is controlled by various internal signals XE, YE, sc, wr, wp, etc. which are produced from a chip enable signal /CE, output enable signal /OE, write enable signal /WE, erase, enable signal /EE, and high write/erase voltage Vpp, which are all supplied to the timing control circuit CNTR from the outside.

The EEPROM 14 is brought to the read mode when the signals /CE and /OE are at the low level, signals /WE and /EE are at the high level, and the high voltage Vpp is not supplied. In this mode, the internal signals /ce becomes low and signals DE, sc and re become high. The row address decoder XDCR, column address decoder YDCR and data input buffer DIB are supplied with a low operation voltage Vcc. In this state, the sense amplifier SA is active to read out data.

The EEPROM 14 is brought to the write mode when the signal /CE is low, signal /OE is high, signal /WE is low, signal /EE is high, and the high voltage Vpp is supplied. In this mode, the internal signals /ce becomes low, signals DE, WP and wr become high, and signals sc, re and DO and /DO7 become low. The high-level DE signal activates the row address decoder XDCR and column address decoder YDCR to select a word line WL and a data line DL of the memory array M-ARY. The row address decoder XDCR, column address decoder YDCR and data input buffer DIB are supplied with a high operation voltage Vpp. A word line WL and a data line DL in connection with a memory cell MC having a floating gate to which electrons are to be injected are brought to high voltages derived from the high voltage Vpp so that the write operation takes place.

The EEPROM 14 is brought to the write verification mode when the signal /CE is low, signal /OE is low, signal /WE is high, signal /EE is high, and the high voltage Vpp is supplied. This mode is identical to the read mode except that the high voltage Vpp is supplied. The row address decoder XDCR, column address decoder YDCR and data input buffer DIB have their operation voltage switched from the high voltage Vpp to the low voltage Vcc so that the write verification operation takes place.

The EEPROM 14 is brought to the erase mode when the signal /CE is low, signal /OE is high, signal /WE is high, the high voltage Vpp is supplied, and the signal /ES is turned from high to low. In consequence, the source lines CS of memory cells MC have the line voltage switched from the high voltage Vpp to the ground voltage by the erasing circuit ERC so that the erase operation takes place.

Figure 15:
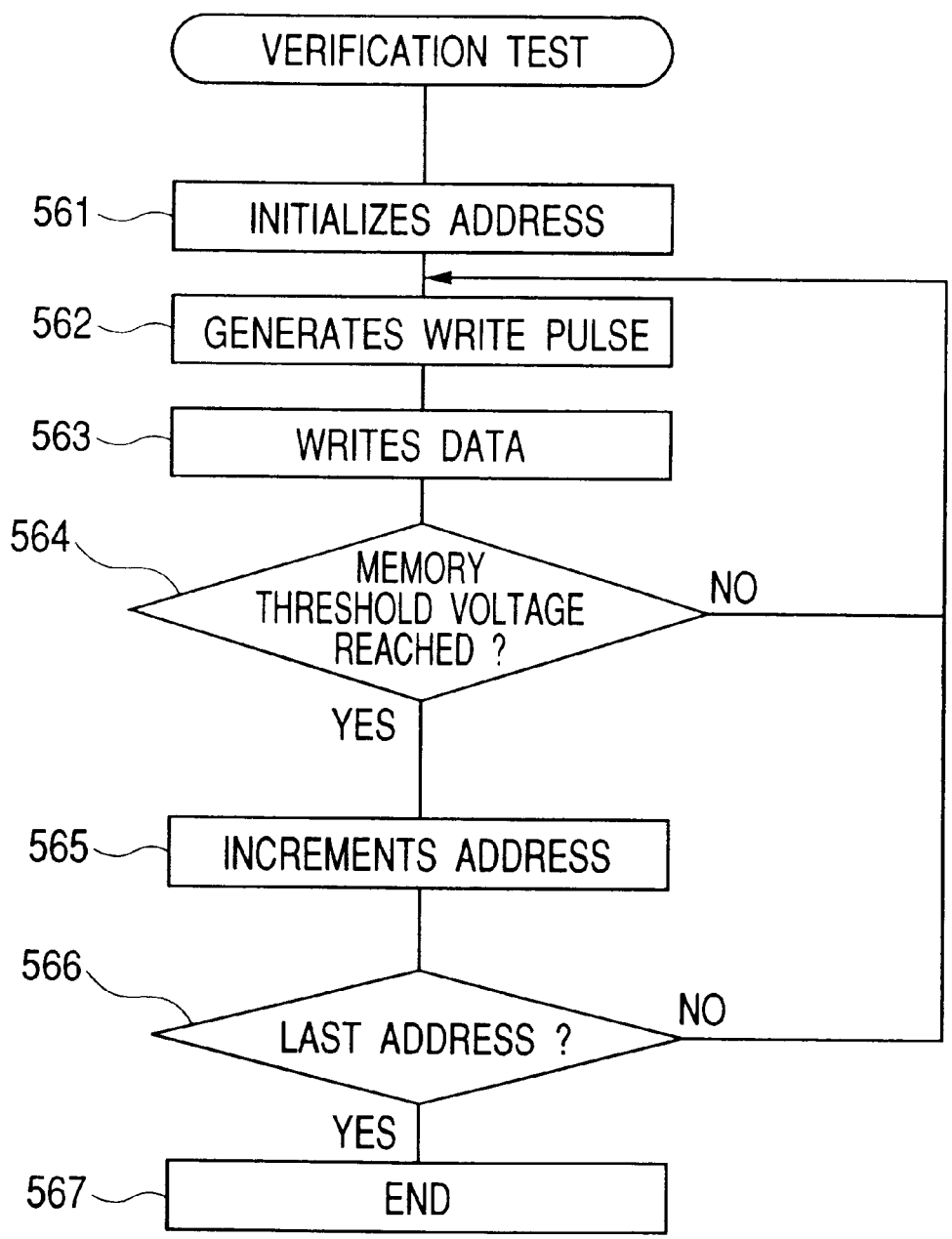
FIG. 15 is a flowchart showing the verification test.

Next, the verification test conducted within the EEPROM 14 will be explained in detail by taking as an example the operation shown by the flowchart of FIG. 15.

(1) Step 561 initializes the address of the write operation, step 562 generates a write pulse to apply the writing voltage to the memory cell MC of the addressed bit of the EEPROM 14, and step 563 implements the write operation.

(2) In verifying the written data, step 564 judges whether the voltage of the addressed bit has reached the memory threshold voltage level. This write verification operation of steps 562–564 is repeated until the readout data signal reaches the threshold voltage level.

(3) Upon confirming the data writing based on the arrival of a bit voltage at the memory threshold voltage level, step 565 increments the address. Step 566 judges whether the address is the last address. The write operation and write verification operation of the steps 562–566 are repeated until all bits of the memory array are verified to complete the test at step 567.

Figure 17:
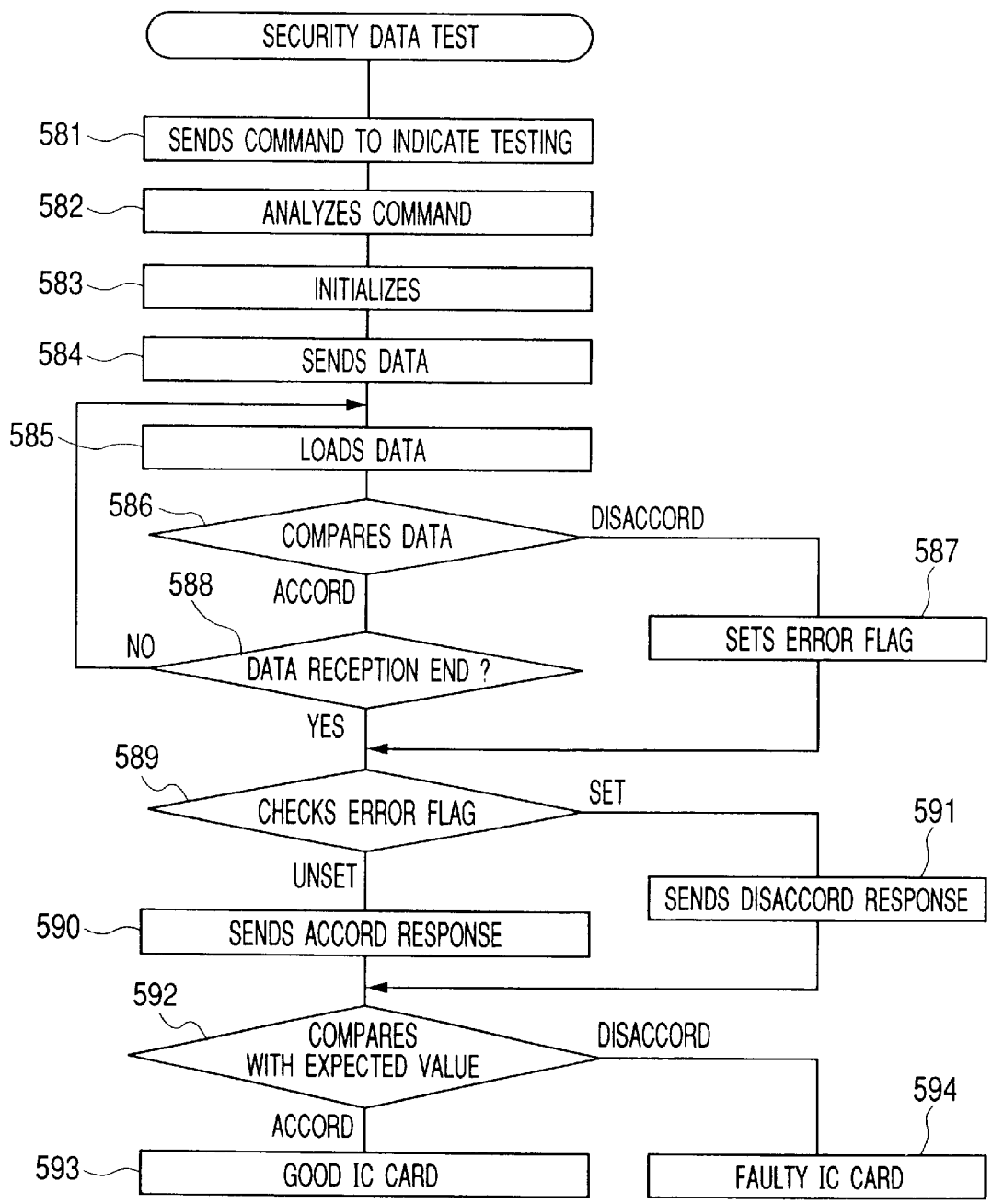
FIG. 17 is a flowchart showing the testing scheme which maintains the security of the contents of the card.

Next, a method of testing security data, such as the password key, stored in the EEPROM 14 will be explained by taking as an example the operation shown by the flowchart of FIG. 17.

Due to the nature of security data stored in the EEPROM 14, it is not possible technically for the test system to read the data out of the IC card 33 for testing. The following explains a testing scheme, with the security matter being considered, for the data in the EEPROM 14.

(1) The tester sends an EEPROM data evaluation command to the IC card 33 to indicate the testing of the IC card 33: (step 581).

(2) The IC card 33 analyzes the received command to recognize the implementation of a security data test by the system: (step 582), and activates the internal security evaluation program for the reception of EEPROM test data sent from the tester and the initialization of the comparison error flag and the like: (step 583).

(3) The tester sends data, which has the same content as data of the EEPROM 14 under test, to the IC card 33 sequentially and continuously: (step 584). This data generally has a size of ten to several tens of kilo-bytes.

(4) Step 585 loads the EEPROM data from the tester into the accumulator A of the CPU 11 by way of the serial-to-parallel conversion circuit in the interface circuit 16 within the IC card 33, and step 586 compares data of the EEPROM 14, which is loaded in the accumulator B, with the received data in the accumulator A. In response to the result of comparison, the next set of data are compared. Otherwise, in response to a disagreeing result of comparison, step 587 sets the error flag.

(5) The IC card 33 repeats the operations of steps 585 and 586 until the end of reception of all EEPROM data at step 588. Step 589 looks for an error flag. In case the error flag is found to be in a reset condition indicative of the accord of all data of the EEPROM 14, step 590 sends a response of accord to the tester. Otherwise, if the error flag is found to be set indicative of disagreement of data of the EEPROM 14, step 591 sends a response of disagreement to the tester.

(6) Step 592 compares the response data from the IC card 33 with the expected value of the accord response. In response to the result of comparison, step 593 determines that the IC card 33 is a good product. Otherwise, in response to a disagreeing result of comparison, step 594 determines that the IC card 33 is a faulty product.

In this manner, in dealing with security data, data comparison and judgement are conducted within the IC card 33 and only the result of judgement is taken out of the card. The external equipment, such as the tester, can discriminate whether the IC card 33 is a good product or a faulty product by checking the state of the error flag.

The foregoing embodiment of the IC card producing method achieves the following effectiveness.

(1) Based on the adoption of the testing scheme including the chip testing of step 200 and the IC card testing of steps 500–800 for the IC card 33 in its state having a tested chip 2, it is possible to enhance the reliability of the IC cards 33.

(2) Based on the adoption of the dual testing scheme for the IC card 33, including the written data verification test of the IC card internal memory, such as the EEPROM 14, and the write/read test of the internal memory conducted by the tester concurrently, it is possible to enhance the reliability of the storage area of the IC card 33 and information in the storage area.

(3) Based on the data comparison and judgement inside the IC card 33 and delivery of only an agreeing or disagreeing result to the outside, it is possible to maintain security and improve the adaptability of the testing equipment, such as the tester and reader/writer which are associated with the IC card 33.

Although the present invention has been explained for a specific embodiment, the invention is not confined to the foregoing embodiment, but can be altered obviously in various ways without departing from the essence of the invention.

The IC card producing method based on this invention is particularly useful for IC card production in that it includes reliable and general testing steps adapted to a variety of IC cards, and its write test and read test can be applied to the IC card producing method which includes testing steps for an IC card internal memory, such as a ROM and a RAM.

What is claimed is:

1. A method of producing an IC card comprising:

making a plurality of circuits, each including a CPU and EEPROM onto a semiconductor wafer;

cutting the semiconductor wafer to make a plurality of semiconductor chips, each including at least one of the plurality of circuits;

mounting each of selected ones of the plurality of semiconductor chips into an IC base to produce an IC card; and inspecting the IC card to test an electrical characteristics of the IC card;

wherein the inspecting includes:
    providing a programming command and data to be programmed for the EEPROM in the IC card from outside of the IC card into the IC card;
    converting the programming command and the data to be programmed from serial format to a parallel format;
    analyzing the converted programming command using the CPU;
    storing the converted data in a first accumulator of the CPU according to a result of the analyzing;
    programming the converted data stored in the first accumulator to ones of memory cells in the EEPROM;
    executing a first testing in the EEPROM to verify whether or not the converted data is programmed in the ones of the memory cells, the first testing including:
        reading data from the ones of the memory cells; and
        verifying whether threshold voltages of the ones of the memory cells are matched to threshold voltages according to the converted data; wherein
    if the threshold voltages of the ones of the memory cells are matched to the threshold voltages according to the converted data in the first testing, executing a second testing, including:
        accessing the ones of the memory cells using the CPU and storing data read out from the ones of the memory cells into a second accumulator of the CPU;
        comparing the data stored in the first accumulator with the data stored in the second accumulator; and
        outputting data related to comparison result of the comparing to the outside of the IC card.

2. A method of producing an IC card according to claim 1, wherein the second testing further includes:
    retrying the comparing if the comparison result of the comparing represents inconsistency.

3. A method of producing an IC card according to claim 1, wherein the inspecting further includes:
    retrying the programming if the threshold voltages of the ones of the memory cells are not matched to the threshold voltages according to the converted data in the first testing.

4. A method of producing an IC card according to claim 1, wherein, in the providing, the programming command and data to be programmed for the EEPROM in the IC card are provided as serial data based on a serial data transfer from a testing apparatus coupled to the IC card to an external terminal of the IC card.

5. A method of producing an IC card according to claim 4, wherein the data related to the comparison result of the comparing is provided as serial data based on the serial data transfer from an external terminal of the IC card to the testing apparatus.

6. A method of producing an IC card according to claim 1, wherein, in the providing, the programming command and data to be programmed for the EEPROM in the IC card are provided by a radio wave generated from a testing apparatus coupled to the IC card, and wherein the radio wave is received by an antenna in the IC card, and is converted into a serial form by a modulation/demodulation circuit coupled to the antenna.

7. A method of producing an IC card according to claim 6, wherein the data related to the comparison result of the comparing is provided from the IC card to the testing apparatus by the radio wave using the modulation/demodulation circuit and the antenna.

* * * * *